(12) United States Patent
Jerng

(10) Patent No.: US 8,340,607 B2
(45) Date of Patent: Dec. 25, 2012

(54) DUAL-BAND TRANSCEIVER

(75) Inventor: Albert Jerng, Los Gatos, CA (US)

(73) Assignee: Mediatek Inc., Hsin-Chu (TW)

( * ) Notice: Subject to any disclaimer, the term of this patent is extended or adjusted under 35 U.S.C. 154(b) by 519 days.

(21) Appl. No.: 12/413,317

(22) Filed: Mar. 27, 2009

(65) Prior Publication Data

US 2010/0248669 A1  Sep. 30, 2010

(51) Int. Cl.
*H01Q 11/12*  (2006.01)
(52) U.S. Cl. ............................................... 455/118
(58) Field of Classification Search ............... 455/118, 455/313–115, 317–318
See application file for complete search history.

(56) References Cited

U.S. PATENT DOCUMENTS

| 7,215,933 | B1 * | 5/2007 | Tse et al. | 455/127.2 |
| 2007/0178869 | A1 * | 8/2007 | Park et al. | 455/260 |
| 2008/0096508 | A1 * | 4/2008 | Luff | 455/209 |
| 2008/0261650 | A1 * | 10/2008 | Piriyapoksombut et al. | 455/552.1 |

\* cited by examiner

*Primary Examiner* — Robert Pascal
*Assistant Examiner* — Khiem Nguyen
(74) *Attorney, Agent, or Firm* — Sawyer Law Group, P.C.

(57) ABSTRACT

A dual-band transceiver is disclosed. In one embodiment, the system includes a first mixer circuit that generates a first signal having a first frequency that is within a first predefined frequency range. The system also includes a second mixer circuit that generates a second signal having one of a second frequency that is within a second predefined frequency range and a third frequency that is within a third predefined frequency range, and wherein each of the first mixer circuit and the second mixer circuit are used for at least two frequency bands.

8 Claims, 6 Drawing Sheets

DUAL-BAND TRANSCEIVER

FIELD OF THE INVENTION

The present invention relates to integrated circuits, and more particularly to a dual-band transceiver utilizing such integrated circuits.

BACKGROUND OF THE INVENTION

Conventional dual-band transmitters use two separate radio frequency (RF) chains, one RF chain for each band. For example, an IEEE 802.11 system has two frequency bands that are used for service: a b/g-band for 2.4 GHz communications, and an a-band for 5 to 6 GHz communications. To support both of these bands, two separate paths (circuits) for two different frequencies are required, one dedicated to the lower band, and one to the upper band. Because conventional dual-band transmitters require two separate RF chains, conventional dual-band transmitters also require a local oscillator (LO) input and associated LO buffer circuits for each RF chain. This, unfortunately, requires sufficient silicon die area to accommodate these RF chains.

Accordingly, what is needed is an improved dual-band transceiver. The dual-band transceiver should be simple and cost-effective. The present invention addresses such a need.

SUMMARY OF THE INVENTION

A dual-band transceiver is disclosed. In one embodiment, a system includes a first mixer circuit that generates a first signal having a first frequency that is within a first predefined frequency range. The system also includes a second mixer circuit that generates a second signal having a second frequency that is within a second predefined frequency range and a third frequency that is within a third predefined frequency range, and wherein each of the first mixer circuit and the second mixer circuit are used for at least two frequency bands.

DETAILED DESCRIPTION OF THE INVENTION

The present invention relates to integrated circuits, and more particularly to a dual-band transceiver utilizing such integrated circuits. The following description is presented to enable one of ordinary skill in the art to make and use the invention, and is provided in the context of a patent application and its requirements. Various modifications to the preferred embodiment and the generic principles and features described herein will be readily apparent to those skilled in the art. Thus, the present invention is not intended to be limited to the embodiments shown, but is to be accorded the widest scope consistent with the principles and features described herein.

A system and method in accordance with the present invention for providing a dual-band transceiver is disclosed. The system includes a transceiver that shares circuitry between two radios, making the system more efficient. In particular embodiments, the same intermediate frequency (IF) and local oscillator (LO) frequency plan enables the dual-band transceiver to share the same IF path for a b/g-band (2.4 GHz) and an a-band (4.9 to 5.9 GHz). As a result, less silicon die area is used. To more particularly describe the features of the present invention, refer now to the following description in conjunction with the accompanying figures.

Figure 1:
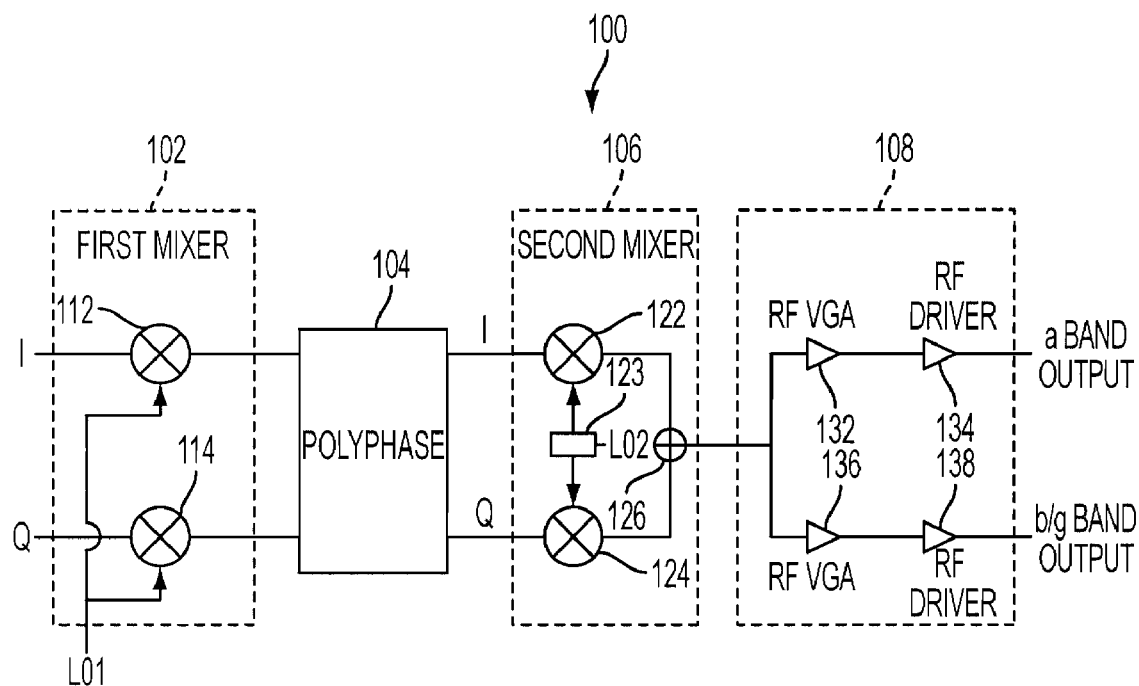
FIG. 1 is a diagram of a dual-band transmitter in accordance with one embodiment.

FIG. 1 is a diagram of a dual-band transmitter 100 in accordance with one embodiment. As FIG. 1 shows, the transmitter 100 includes a first mixer stage 102, a polyphase filter 104, a second mixer stage 106, and an output stage 108. In one embodiment, the first mixer stage 102 includes an inphase mixer 112 for receiving an inphase (I) signal and a quadrature mixer 114 for receiving a quadrature (Q) signal; and both mixers 112 and 114 receive a first local oscillator (LO1) signal. In one embodiment, the second mixer stage 106 includes an inphase mixer 122 for receiving an inphase (I) signal, a quadrature generator 123, and a quadrature mixer 124 for receiving a quadrature (Q) signal, and a signal combiner 126. In one embodiment, both of the mixers 122 and 124 receive a second local oscillator (LO2) signal. In one embodiment, the LO2 signal enters the quadrature generator 123, which outputs an LO2 signal at 0 degrees phase and an LO2 signal at 90 degrees phase. These two quadrature LO2 signals are then applied to the inphase mixer 122 and quadrature mixer 124, respectively. In one embodiment, the output stage 108 includes a radio frequency (RF) variable gain amplifier (VGA) 132 and an RF driver 134, which, in one embodiment, may be used to output a b/g-band signal. The output stage 108 also includes an RF VGA 136 and an RF driver 138, which, in one embodiment, may be used to output an a-band signal.

Figure 2:
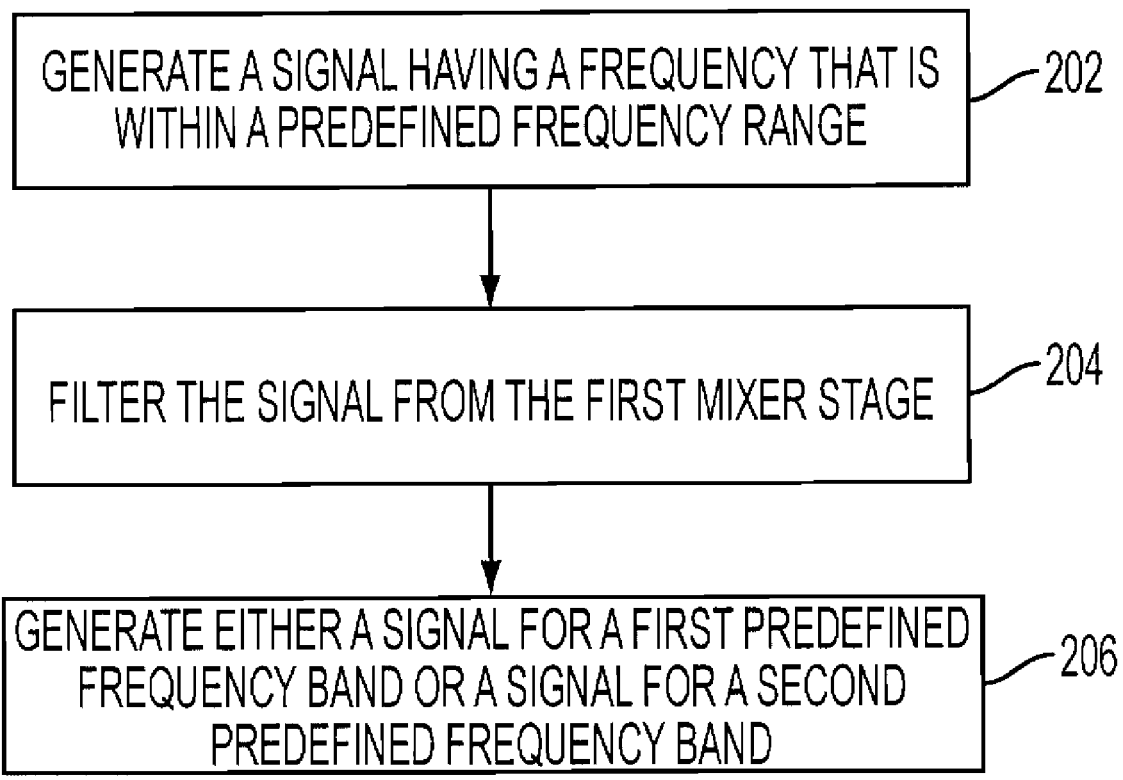
FIG. 2 is a flow chart showing a method for providing dual-band signals in accordance with the present invention.

FIG. 2 is a flow chart showing a method for providing dual-band signals in accordance with the present invention. Referring to both FIGS. 1 and 2, the process begins in step 202 where after receiving I and Q signals, the first mixer stage 102 generates a signal having a frequency that is within a predefined frequency range. In one embodiment, the first mixer stage 102 performs a frequency up conversion to generate a signal having a predefined frequency range of 3.2 to 4 GHz. The frequency up conversion is achieved by mixing the received signal with an LO1 signal. As described in more detail below, this signal may be used for both the a-band and the b/g-band. Next, in step 204, the polyphase filter 104 generates quadrature phases of the signal from the first mixer stage 102.

Next, in step 206, after receiving the quadrature phases from the polyphase filter 104, the second mixer stage 106 generates either a signal for a first predefined frequency band (e.g., b/g-band) or a signal for a second predefined frequency band (e.g., a-band). In one embodiment, to generate either signal, the second mixer stage 106 performs a frequency up conversion to one of the respective predefined frequency bands. The frequency up conversion is achieved by mixing the received signal with quadrature phases of an LO2 signal. By applying quadrature signals with a +90 or −90 degree phase difference, the frequency up-conversion can either be the addition of the IF and LO2 frequencies, or the subtraction of the IF and LO2 frequencies.

In one embodiment, for a b/g-band, the second mixer stage 106 performs a frequency up conversion to generate a signal having a predefined frequency range of 800 MHz. In one embodiment, the final b/g-band frequency may be achieved by subtracting the frequency generated by the second mixer stage 106 from that of the first mixer stage 102 (e.g., 3.2 GHz to 800 MHz=2.4 GHz).

In one embodiment, to achieve b/g-band RF frequency, the second mixer stage 106 performs a frequency up conversion to generate a signal having a predefined frequency of 2.4 GHz. In a specific embodiment, the final b/g-band RF frequency (e.g., 2.4 GHz) may be achieved by subtracting the LO2 frequency (e.g., 0.8 GHz) generated by the second mixer stage 106 from the IF frequency (e.g., 3.2 GHZ) from the first mixer stage 102 (e.g., 3.2 GHz to 0.8 GHz=2.4 GHz).

In one embodiment, to achieve an a-band RF frequency, the second mixer stage 106 performs a frequency up conversion to generate a signal having a predefined frequency range of 4.8 to 6 GHz. In specific embodiment, the final a-band RF frequency (e.g., 4.8 to 6 GHz) may be achieved by adding the LO2 frequency (e.g., 1.6 to 2 GHz) generated by the second mixer stage 106 to the IF frequency (e.g., 3.2 to 4 GHZ) from the first mixer stage 102 (e.g., 3.2 to 4 GHz+1.6 to 2 GHz=4.8 to 6 GHz).

Accordingly, this frequency plan enables the sharing of the first mixer stage 102, polyphase filter 104, and second mixer stage 106 for two bands (e.g., b/g-band and a-band). In one embodiment, the resulting signal passes through the appropriate amplifier chains in order to increase the signal to a certain level for transmission to the antenna.

As described in more detail below, the frequencies of the second mixer stage 106 may be selectable (e.g., 0.8 GHz or 1.6 to 2 GHz) to produce the sum frequency at its output for the a-band and the difference frequency at the output for the b/g-band.

In one embodiment, the second mixer stage 106 is selectable to produce a sum frequency at its output for the a-band or selectable to produce a difference frequency at its output for the b/g band. In one embodiment, the selectivity may be achieved by changing the phase difference of the quadrature LO2 signal for b/g-band versus a-band. In particular embodiments, quadrature LO2 signals are used in the pair of mixers 122 and 124 in the second mixer 106, where quadrature signals means that an LO2 signal with 0 degrees phase and an LO2 signal with 90 degrees phase are used. By using an LO2 signal with 0 degrees phase and an LO2 signal with −90 degrees phase, the second mixer may be changed from producing the sum of IF and LO2 frequencies to producing the difference of IF and LO2 frequencies. To achieve this, the phase of the 90 degree LO2 signal may be "flipped" by 180 degrees." This results in a −90 degree LO2 signal. In effect, flipping a signal's phase by 180 degrees is the same as reversing the polarity of a differential signal.

Figure 3:
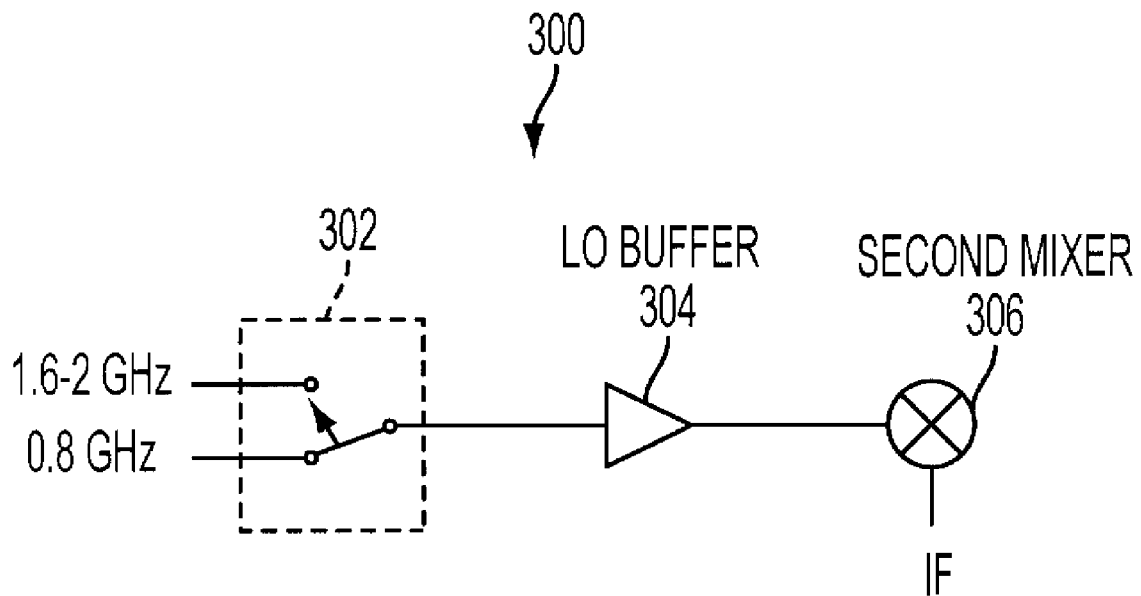
FIG. 3 is a diagram of a switch circuit that may be used with the second mixer stage to select between two different LO2 frequencies, in accordance with one embodiment.

FIG. 3 is a diagram of a switch circuit 300 that may be used with the second mixer stage 106 to select between two different LO2 frequencies, in accordance with one embodiment. As FIG. 3 shows, the switch circuit 300 includes a switch 302, an LO buffer 304, and a mixer 306. In one embodiment, mixer 306 corresponds to mixer 122 or mixer 124 of FIG. 1. In one embodiment, the LO2 frequency may be switched between b/g-band mode (800 MHz) and a-band mode (1.6 to 2 GHz) by being multiplexed between two signals of two different frequencies (e.g., 800 MHZ and 1.6 to 2 GHz).

Figure 4:
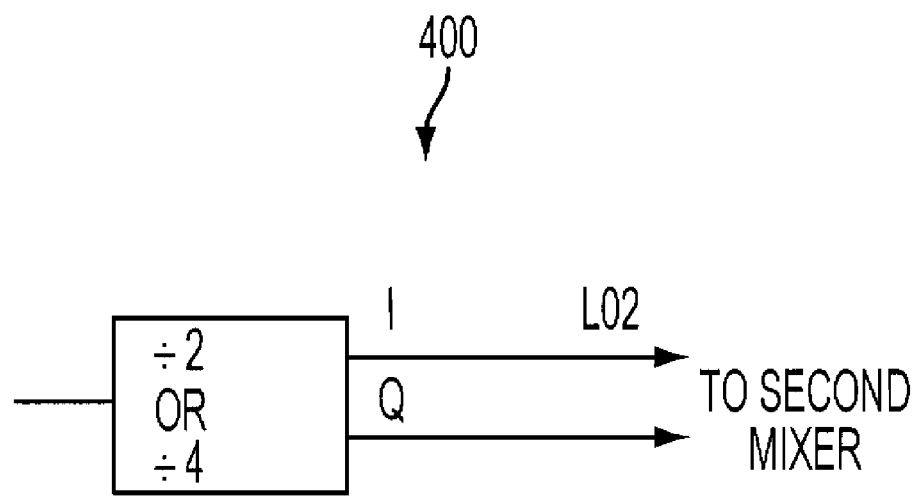
FIG. 4 is a diagram of a selectable divider circuit that may be used with the second mixer stage to select between two different LO2 frequencies, in accordance with one embodiment.

FIG. 4 is a diagram of a selectable divider circuit 400 that may be used with the second mixer stage 106 to select between two different LO2 frequencies (e.g., /2 or /4), in accordance with one embodiment. In one embodiment, this approach also provides the 0/90° signals needed to do the upper sideband (USB) or lower sideband (LSB) mixing in the second mixer. In one embodiment, the selectable divider circuit 400 may have a predefined selectable value (e.g., 2, 4, etc.). For example, if LO2 has an initial frequency range of 3.2 to 4 GHz and is divided by 2, a final LO2 frequency range of 1.6 to 2 GHz may be achieved. If the same LO2 having an initial frequency range of 3.2 to 4 GHz is divided by 4, a final LO2 having a frequency range of 0.8 to 1 GHz may be achieved.

Figure 5:
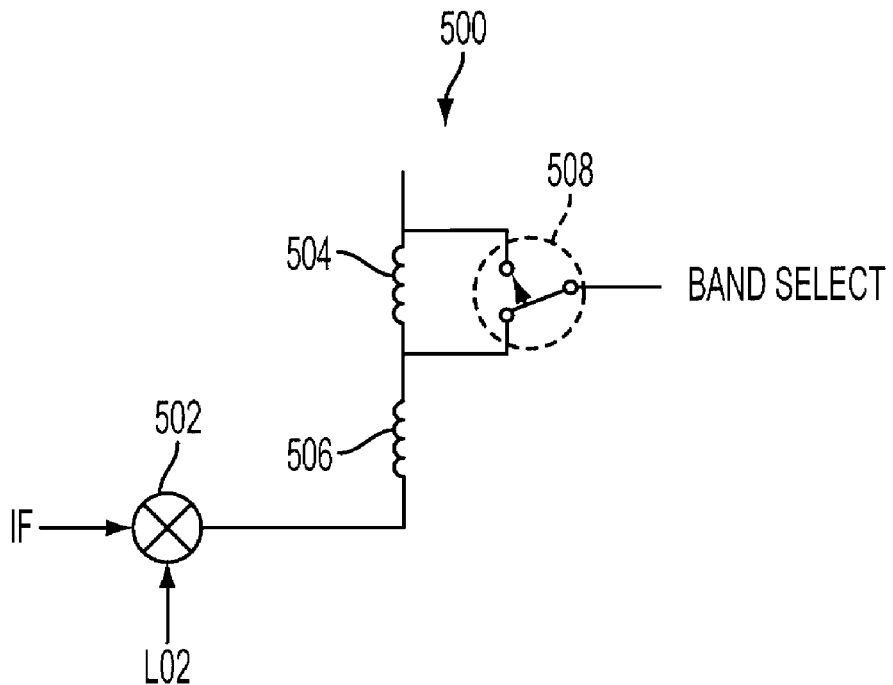
FIG. 5 is a diagram of an inductor circuit that may be used with the second mixer stage to provide a load for a desired gain, in accordance with one embodiment.

FIG. 5 is a diagram of an inductor circuit 500 that may be used with the second mixer stage 106 to provide a load for a desired gain, in accordance with one embodiment. As FIG. 5 shows, the inductor circuit 500 includes a mixer 502, inductors 504 and 506, and a switch 508. In particular embodiments, if the output frequency of the second mixer stage 106 is outputted at vastly different frequencies (2.4 GHz or 4.8 GHz), the inductor circuit 500 may provide a load to provide an appropriate gain at the two frequencies. For example, when the switch 508 is open, the effective inductance is provided by both inductors 504 and 506 to create a tuned resonance at 2.4 GHz. When the switch is closed, the inductor 504 is shorted and the load inductance is provided by the inductor 506 for operation at the higher frequency band.

Figure 6:
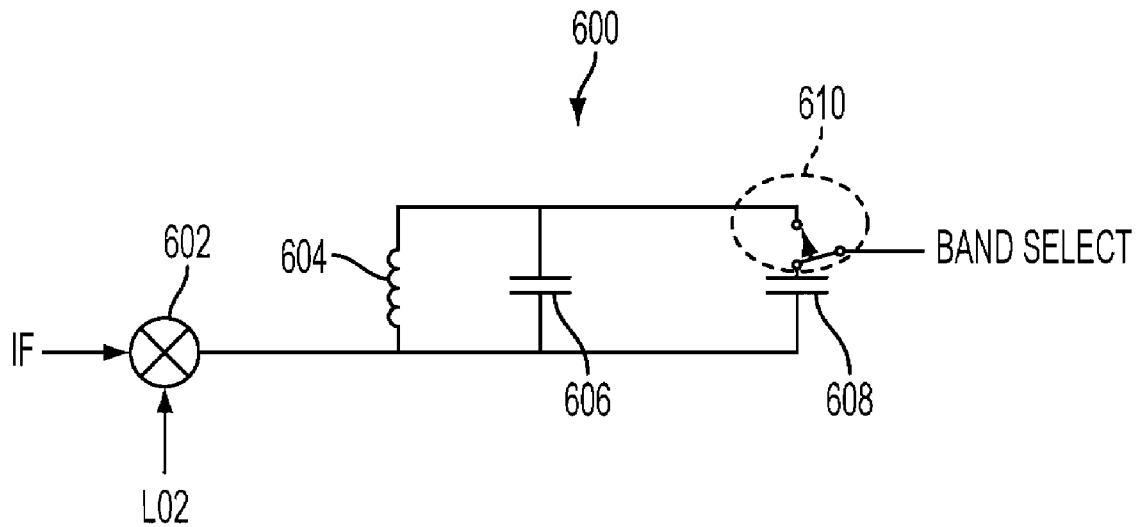
FIG. 6 is a diagram of a capacitor circuit that may be used with the second mixer stage to tune the output of the second mixer stage, in accordance with one embodiment.

FIG. 6 is a diagram of a capacitor circuit 600 that may be used with the second mixer stage 106 to tune the output of the second mixer stage 106, in accordance with one embodiment. As FIG. 6 shows, the capacitor circuit 600 includes a mixer 602, an inductor 604, capacitors 606 and 608, and a switch 610. In one embodiment, the two modes of the output of the second mixer 106 of FIG. 1 will either be 2.4 GHz for the b/g-band or 4.8 to 6 GHz for the a-band. The output handles these two vastly different frequencies. In particular embodiments, the capacitor circuit 600 may provide a tuned load to provide gain at a certain frequency. For example, when the switch 610 is open, the effective capacitance is provided by the capacitor 606. When the switch is closed, the effective capacitance is provided by both of the capacitors 606 and 608.

Figure 7:
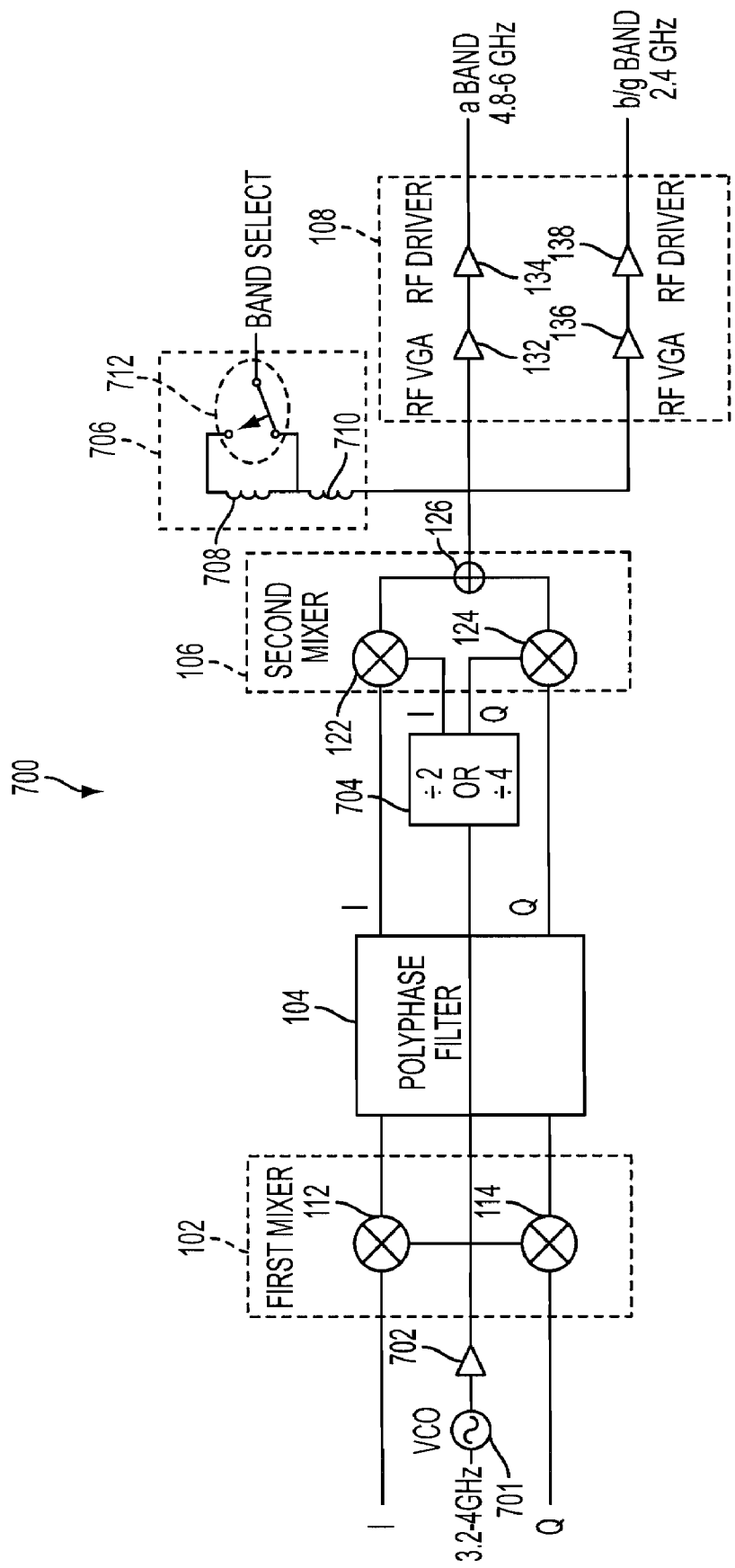
FIG. 7 is a diagram of a dual-band transmitter in accordance with one embodiment.

FIG. 7 is a diagram of a dual-band transmitter 700 in accordance with one embodiment. The dual-band transmitter 700 includes a similar element to that of FIG. 1, and, as such, like elements are labeled with like reference numbers. The dual-band transmitter 700 is different from that of FIG. 1 in that the dual-band transmitter 700 includes a VCO 701, an inverter 702, a selectable divider circuit 704, and an inductor circuit 706.

In one embodiment, the VCO 701, an inverter 702 provide an LO signal with sufficient signal strength to drive mixers 112 and 114, and divider 704. In one embodiment, the selectable divider circuit 704 is similar to that of FIG. 4, and the inductor circuit is similar to that of FIG. 5.

Figure 8:
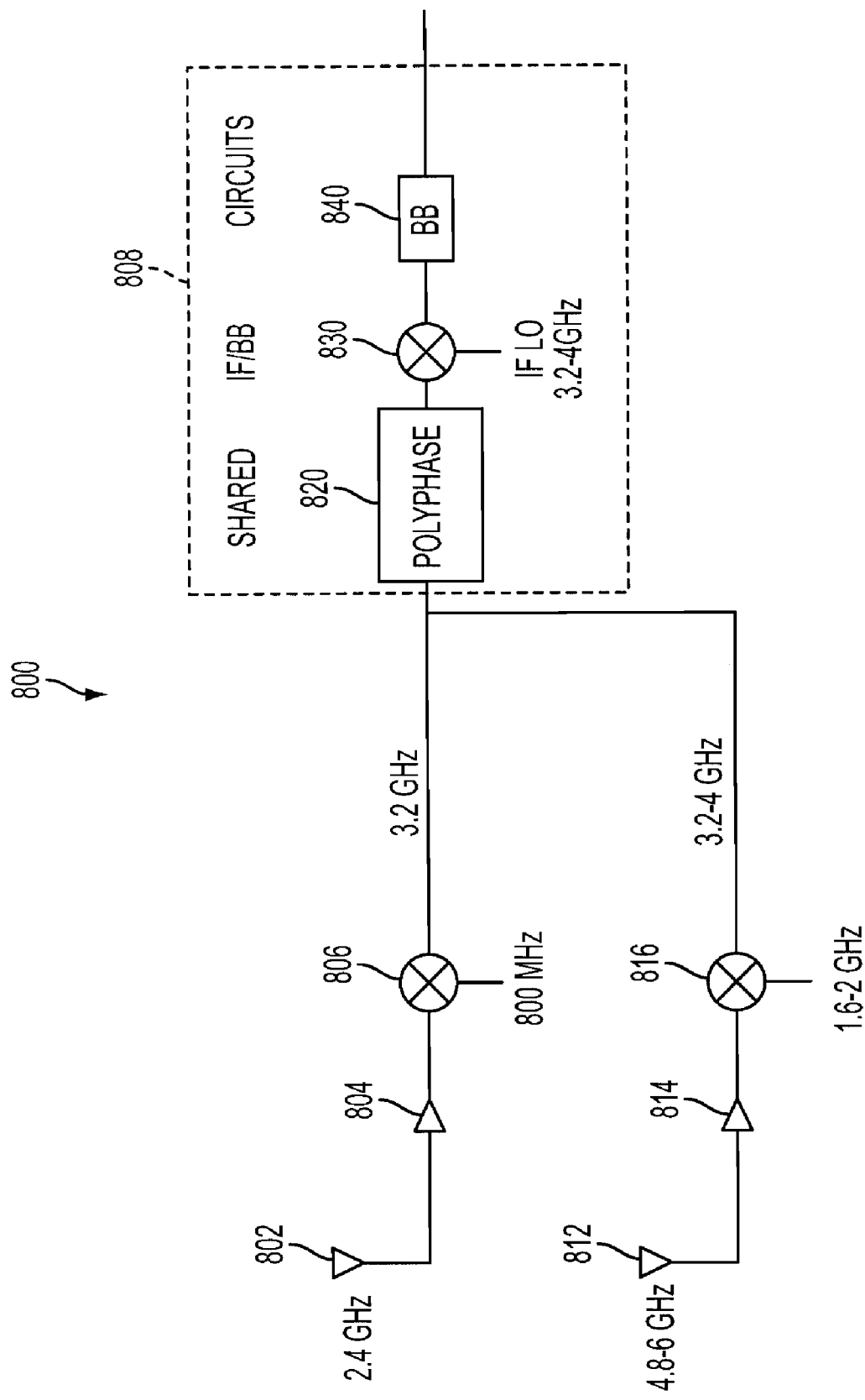
FIG. 8 is a diagram of a dual-band receiver in accordance with one embodiment.

Although the present invention disclosed herein is described in the context of transmitters, the present invention may also apply to receivers, and still remain within the spirit and scope of the present invention. For example, FIG. 8 is a diagram of a dual-band receiver 800 in accordance with one embodiment. As FIG. 8 shows, the dual-band receiver 800 includes an antenna 802, low-noise amplifier (LNA) 804, and mixer 806 for a b/g-band mode, and an antenna 812, LNA 814, and mixer 816 for an a-band mode. The dual-band receiver 800 also includes a polyphase filter 820, and a shared mixer 830 for both b/g-band and a-band modes, and a baseband filter and variable-gain amplifier (BB) 840.

In one implementation, the frequency plan is as follows:
b/g-band mode: IF=4/3 RF (2.4 GHz)=3.2 GHz
a-band mode: IF=2/3 RF (4.8 to 6 GHz)=3.2 to 4 GHz Generally, the dual-band receiver 800 is the reverse operation of the dual-band transmitter 100. For example, in the examples above with regard to the dual-band transmitter 100, the first mixer stage 102 produces a signal having a frequency range of 3.2 to 4 GHz, and the second mixer stage 106 produces a signal having a frequency range of 0.8 GHz or 1.6 to 2 GHz. Here, with regard to the dual-band receiver 800, the first mixer 806 for the b/g-band mode uses an LO signal having a frequency range of 0.8 GHz; and the first mixer 816 for the a-band mode uses an LO signal having a frequency range of 1.6 to 1.2 GHz. Here, in one embodiment, each of the b/g-band and a-band modes uses separate mixers 806 and 816, because they use separate amplifiers 804 and 814. The second mixer 830 converts both bands to the same frequency. As such, in one embodiment, the second mixer 830 is used for both the b/g-band and a-band modes, and produces a signal having a frequency range of 3.2 to 4 GHz.

According to the system and method disclosed herein, the present invention provides numerous benefits. For example, embodiments of the present invention minimize die area and LO routing, which results in a more cost-effective design for dual-band applications.

Because the shared IF path replaces die area through circuit reuse, embodiments of the present invention also simplify LO routing. For multiple-input multiple-output (MIMO) systems which require multiple transmitters on one chip, the die area savings is multiplied and the LO routing will be shorter. Because many RF blocks contain inductors, the number of inductors required will be reduced substantially.

A system and method in accordance with the present invention for providing a dual-band transceiver has been disclosed. The system includes a transceiver that shares circuitry between the two radios, making the system more efficient. In particular embodiments, the same intermediate frequency (IF) and local oscillator (LO) frequency plans enable the dual-band transceiver to share the same IF path for a b/g-band (2.4 GHz) and an a-band (4.9 to 5.9 GHz). As a result, less silicon die area is used.

The present invention has been described in accordance with the embodiments shown. One of ordinary skill in the art will readily recognize that there could be variations to the embodiments, and that any variations would be within the spirit and scope of the present invention. Accordingly, many modifications may be made by one of ordinary skill in the art without departing from the spirit and scope of the appended claims.

What is claimed is:

1. A circuit comprising:
a first mixer circuit that generates a first signal having a first frequency that is within a first predefined frequency range; and
a second mixer circuit that generates a second signal having one of a second frequency that is within a second predefined frequency range and a third frequency that is within a third predefined frequency range, and wherein each of the first mixer circuit and the second mixer circuit are used for at least two frequency bands, wherein the second mixer circuit comprises a selectable divider circuit that selects between two different local oscillator frequencies.

2. The circuit of claim 1 wherein the first mixer circuit comprises:
an inphase mixer for receiving an inphase signal; and
a quadrature signal for receiving a quadrature signal, wherein both the inphase mixer and quadrature mixer receive a first local oscillator signal.

3. The circuit of claim 1 wherein the second mixer circuit comprises:
an inphase mixer for receiving an inphase signal; and
a quadrature mixer for receiving a quadrature signal, wherein both the inphase mixer and the quadrature mixer receive a second local oscillator signal.

4. The circuit of claim 1 wherein the circuit further comprises:
a first radio frequency (RF) variable gain amplifier and a first RF driver for a first band; and
a second RF variable gain amplifier and a second RF driver for a second band.

5. The circuit of claim 1 wherein the circuit further comprises a polyphase filter coupled to the first circuit, wherein the polyphase filter generates quadrature phases of the first signal.

6. The circuit of claim 1 wherein the second mixer circuit is selectable to produce the second predefined frequency range and the third predefined frequency range.

7. A circuit comprising:
a first mixer circuit that generates a first signal having a first frequency that is within a first predefined frequency range; and
a second mixer circuit that generates a second signal having one of a second frequency that is within a second predefined frequency range and a third frequency that is within a third predefined frequency range, and wherein each of the first mixer circuit and the second mixer circuit are used for at least two frequency bands, wherein the second mixer circuit comprises an inductor circuit that provides a load for a desired gain.

8. A circuit comprising:
a first mixer circuit that generates a first signal having a first frequency that is within a first predefined frequency range; and
a second mixer circuit that generates a second signal having one of a second frequency that is within a second predefined frequency range and a third frequency that is within a third predefined frequency range, and wherein each of the first mixer circuit and the second mixer circuit are used for at least two frequency bands, wherein the second mixer circuit comprises a capacitor circuit that provides a load for a desired gain.

* * * * *